US008037442B2

United States Patent
Zou et al.

(10) Patent No.: US 8,037,442 B2
(45) Date of Patent: Oct. 11, 2011

(54) METHOD AND APPARATUS FOR SCALING I/O-CELL PLACEMENT DURING DIE-SIZE OPTIMIZATION

(75) Inventors: Peiqing Zou, San Jose, CA (US); Douglas Chang, San Jose, CA (US); Neeraj Kaul, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 336 days.

(21) Appl. No.: 12/323,883

(22) Filed: Nov. 26, 2008

(65) Prior Publication Data

US 2010/0131913 A1 May 27, 2010

(51) Int. Cl.
*G06F 17/50* (2006.01)
(52) U.S. Cl. ........ 716/119; 716/118; 716/122; 716/135; 716/139; 438/106; 257/678
(58) Field of Classification Search .................... 716/52, 716/56, 118, 119, 122, 126, 135, 139; 438/106; 257/678
See application file for complete search history.

(56) References Cited

U.S. PATENT DOCUMENTS

| 5,155,065 | A  | * | 10/1992 | Schweiss ..................... 438/599 |
| 6,457,157 | B1 | * | 9/2002 | Singh et al. .................. 716/122 |
| 7,266,789 | B2 | * | 9/2007 | Chung-Maloney et al. .. 257/203 |
| 2002/0199155 | A1 | * | 12/2002 | Kovacs-Birkas ................. 716/1 |
| 2004/0006754 | A1 | * | 1/2004 | Sonohara .......................... 716/8 |
| 2006/0064660 | A1 | * | 3/2006 | Chung-Maloney et al. ...... 716/8 |
| 2009/0051050 | A1 | * | 2/2009 | Bakker et al. .................. 257/784 |

* cited by examiner

*Primary Examiner* — Thuan Do
*Assistant Examiner* — Nha Nguyen
(74) *Attorney, Agent, or Firm* — Park, Vaughan, Fleming & Dowler LLP

(57) ABSTRACT

One embodiment of the present invention provides a system that scales an I/O-cell placement during die-size optimization. During operation, the system starts by receiving an initial die-size for a die and an initial I/O-cell placement for a set of I/O cells. The system also receives a target die-size for the die. The system then determines die-size changes between the initial die-size and the target die-size. Next, the system identifies available spaces between the set of I/O cells in the initial I/O-cell placement. The system subsequently scales the initial I/O-cell placement based on the identified available spaces and the die-size changes to obtain a new I/O-cell placement which fits in the target die-size.

19 Claims, 7 Drawing Sheets

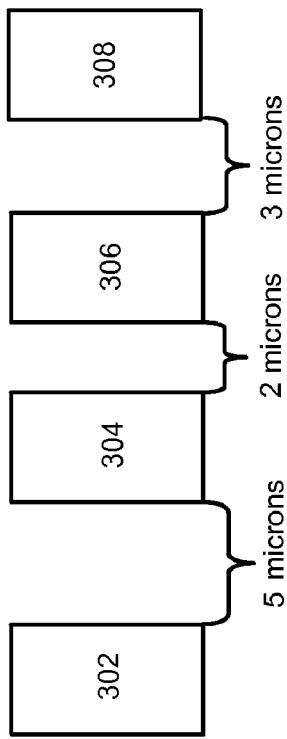
FIG. 3
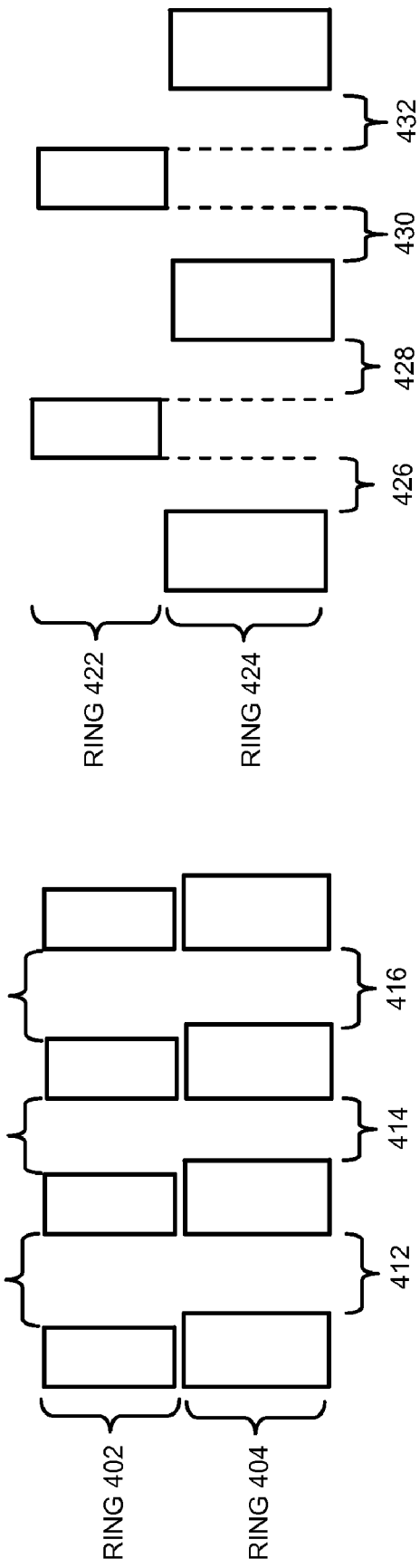
FIG. 4B
FIG. 4A

METHOD AND APPARATUS FOR SCALING I/O-CELL PLACEMENT DURING DIE-SIZE OPTIMIZATION

BACKGROUND

1. Field

The present disclosure generally relates to techniques for designing and manufacturing integrated circuits (ICs). More specifically, the present disclosure relates to a method and an apparatus for modifying input/output (referred to as "I/O" hereafter) cell placement in an IC die when die size changes.

2. Related Art

Dramatic improvements in semiconductor integration circuit (IC) technology presently make it possible to integrate hundreds of millions of transistors onto a single semiconductor IC chip. These improvements in integration densities have largely been achieved through corresponding improvements in semiconductor manufacturing technologies, which have recently achieved ultra-deep-submicron feature sizes. On the flip side, the constant drive toward ever-decreasing feature sizes has led to a significant increase in IC manufacturing costs.

One way to alleviate the increasing IC fabrication cost is to achieve design specifications using a minimum feasible die size. For example, some chip floor planning tools can automatically analyze IC design constraints and identify the smallest routable die size for tape-out. Alternatively, a designer can explore the minimum feasible die size manually.

While exploring the minimum feasible die size of an IC design, the designers need a tool to refit all the original I/O pads and other I/O cells into different shrunk or expanded die boundaries while maintaining the original side, relative order, and alignment of the I/O cells. Conventionally, this is achieved by performing a new cell-by-cell-based placement process from the original I/O placement under certain design constraints. However, this "re-placement" technique has a number of limitations, such as the original design constraints not being appropriate for a changed die size, inability to handle macro cells inside the I/O area, inability to handle multiple I/O rings, and inability to handle rectilinear shaped I/O cells.

Hence, what is needed is an I/O cell re-placement technique during die-size optimization without above-described problems.

SUMMARY

Some embodiments of the present invention provide a system that scales an I/O-cell placement during die-size optimization. During operation, the system starts by receiving an initial die-size for a die and an initial I/O-cell placement for a set of I/O cells. The system also receives a target die-size for the die. The system then determines die-size changes between the initial die-size and the target die-size. Next, the system identifies available spaces between the set of I/O cells in the initial I/O-cell placement. The system subsequently scales the initial I/O-cell placement based on the identified available spaces and the die-size changes to obtain a new I/O-cell placement which fits in the target die-size.

In a variation, the system determines die-size changes between the initial die-size and the target die-size by determining a width change and a height change for the die.

In a variation, the system identifies available spaces between the set of I/O cells by independently identifying available spaces in a row of I/O cells for each side of the die.

In a variation, the system identifies the available spaces in the row of I/O cells by: (1) identifying an available space between each pair of adjacent I/O cells in the row of I/O cells; (2) computing a total available space on the side of the die by summing the available spaces in the row of I/O cells.

In a variation, the system identifies the available space between each pair of adjacent I/O cells by subtracting a minimum space requirement from a distance between the pair of adjacent I/O cells.

In a variation, the system scales the initial I/O-cell placement by independently scaling the I/O-cell placement on each side of the die.

In a variation, the system scales the initial I/O-cell placement on one side of the die by first determining a scaling mode (shrinking/expanding) based on a sign of the die-size change in a direction along the side of the die. The system then scales each of the spaces between pairs of adjacent I/O cells in the row of I/O cells by an amount which is in proportion to a corresponding available space. Moreover, a total amount of scaling for the row of I/O cells is substantially equal to the die-size change.

In a variation, the system scales the initial I/O-cell placement on one side of the die by first determining a scaling mode (shrinking/expanding) based on a sign of the die-size change in a direction along the side of the die. The system then scales each of the spaces between pairs of adjacent I/O cells in the row of I/O cells by an equal amount. Moreover, a total amount of scaling for the row of I/O cells is substantially equal to the die-size change.

In a variation, the system scales the initial I/O-cell placement on one side of the die by first determining a scaling mode (shrinking/expanding) based on a sign of the die-size change in a direction along the side of the die. If the die-size change is negative and has a value greater than the total available space on the side of the die, the system then scales the spaces between pairs of adjacent I/O cells in the row of I/O cells by reducing all available spaces to zero.

In a variation, if the initial I/O-cell placement is a multi-ring I/O-cell placement, the system can either independently scale each ring of the multi-ring I/O-cell-placement, which ignores alignment between the multiple rings of I/O cells. Alternatively, the system can concertedly scale the multiple rings of I/O cells in the multi-ring I/O-cell-placement to maintain alignment between the multiple rings of I/O cells.

In a variation on this embodiment, the set of I/O cells can include: I/O pads; I/O cells comprising multiple I/O pins; macro cells; placement blockages; and filler cells.

BRIEF DESCRIPTION OF THE FIGURES

FIG. 3 illustrates exemplary distances and available spaces associated with a row of I/O cells in accordance with an embodiment of the present invention.

FIG. 4A illustrates a process for identifying common spaces for an exemplary I/O-cell placement which comprises two edge-aligned I/O rings in accordance with an embodiment of the present invention.

FIG. 4B illustrates a process for identifying common spaces for an exemplary I/O-cell placement which comprises two staggered I/O rings in accordance with an embodiment of the present invention

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Integrated Circuit Design Flow

Figure 1:
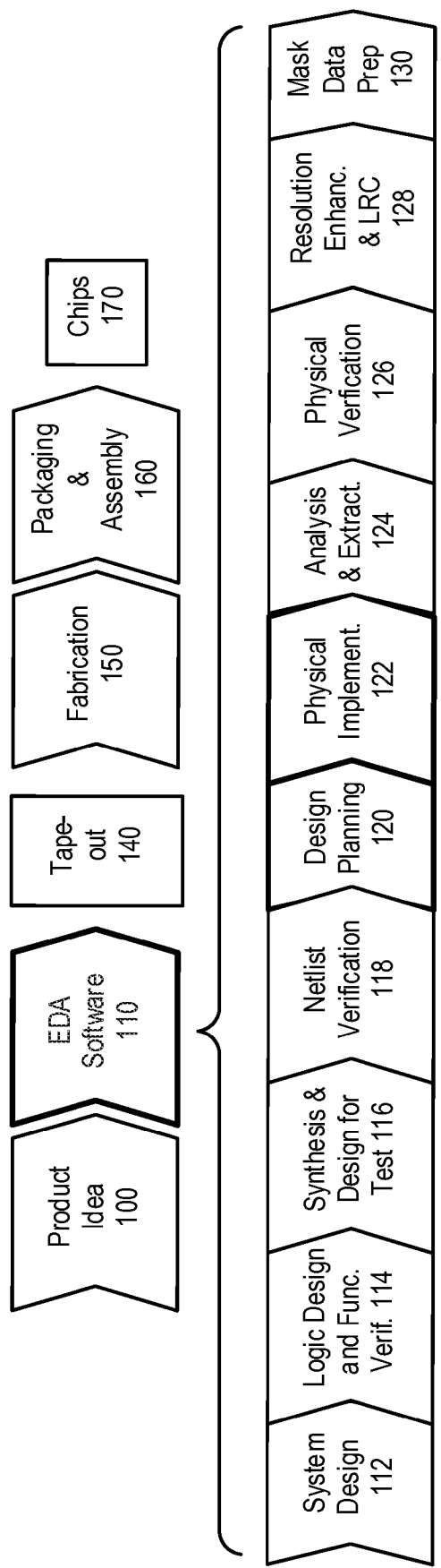
FIG. 1 illustrates various steps in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design for test (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement and lithography rule checking (LRC) (stage 128): This stage involves geometric manipulations of the layout to improve manufacturability of the design and lithography printability checking. Exemplary EDA software products from SYNOPSYS, INC. that can be used at this stage include PROTEUS®, PROTEUS®AF, and SiVL® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the design planning step 120 and physical implementation step 122.

Overview

In order to reduce IC fabrication cost, IC designers routinely explore the minimum feasible die size under design constraints during the chip floor planning stage, and place-and-route stage of the IC design. We also refer to this minimum die-size exploration process as a die-size optimization process below. At the beginning of a die-size optimization process, each IC design has an initial die size (i.e., height× width) to be varied, and an I/O cell placement having an overall structure which needs to be maintained during the optimization. This overall structure can include a number of I/O-cell-placement properties, which can include, but are not limited to: original side (in the die) of all the I/O cells, relative order of the I/O cells, alignment among the I/O cells, and multi-ring structure of the I/O cells. During the die-size optimization, a die-size optimization tool modifies the I/O cell placement to fit in a new die size while maintaining the overall structure of the I/O cell placement.

One embodiment of the present invention provides a technique for determining new I/O cell placements when die size changes. More specifically, rather than re-placing I/O cells one cell at a time, the present technique performs one-dimensional (1D) scaling of the spaces between the original I/O cells based on the amount of die size change, available spaces between the original I/O cells, and a specific scaling function. In one embodiment of the present invention, the I/O-cell placement is partitioned into four sides, which are scaled separately one side (e.g., one row of I/O cells) at a time. After I/O-cell scaling, a new I/O-cell placement is obtained which fits in the new die size in the same manner as the original I/O-cell placement fits in the original die size. Consequently, this I/O-cell scaling technique ("scaling technique" hereafter) can automatically maintain the original I/O cells' sides and relative orders, as well as the I/O-ring structure for multi-I/O-ring designs. Moreover, the present technique facilitates handling macro cells and other complex shaped I/O cells which are difficult for conventional I/O-cell placement techniques. In some embodiments, the scaling technique also obeys minimum I/O-cell spacing requirements and other I/O-cell placement constraints.

I/O-Cell Placements

Figure 2B:
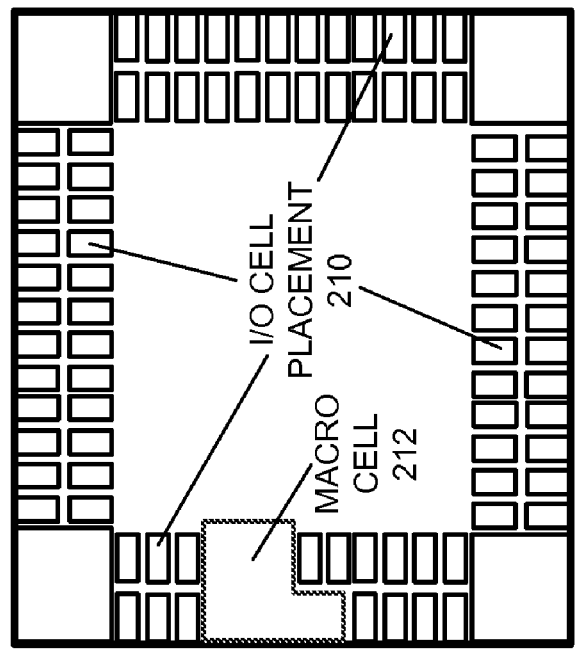
FIG. 2B illustrates an I/O-cell placement which comprises a double-ring I/O-cell-structure and a macro cell.
Figure 2A:
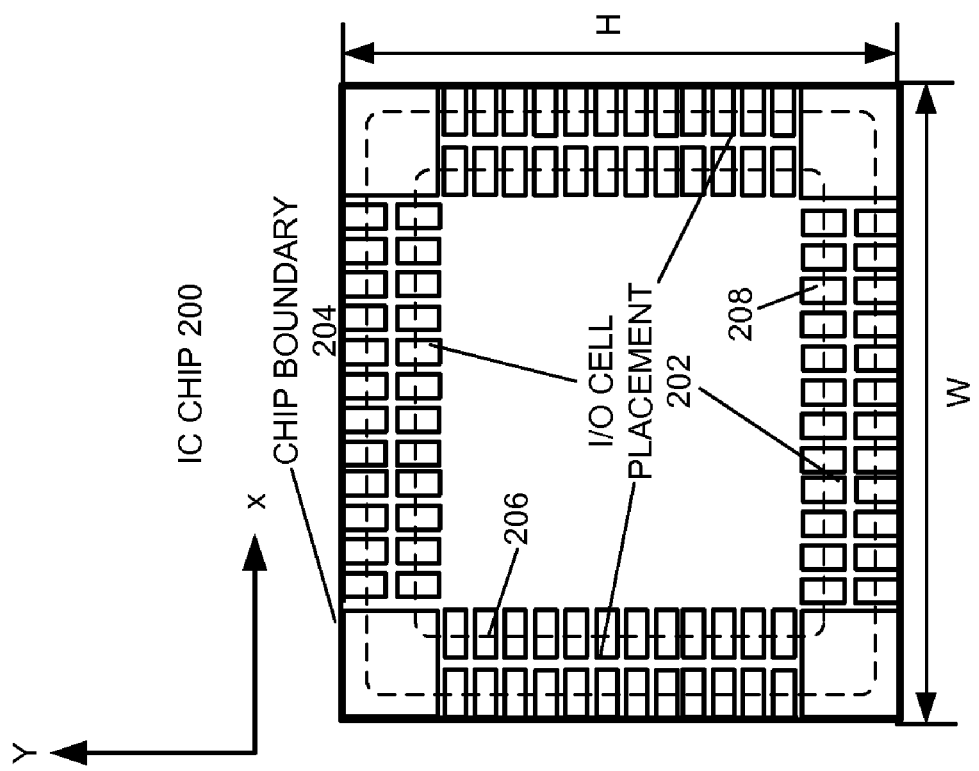
FIG. 2A illustrates an IC chip having a given die size and a double-ring I/O-cell placement.

FIG. 2A illustrates an IC chip 200 having a given die size and a double-ring I/O-cell placement.

As illustrated in FIG. 2A, the die size of IC chip 200 is defined by a width W in the X-dimension and a height H in the Y-dimension. An I/O-cell placement 202 is fit along chip boundary 204 of IC chip 200. More specifically, I/O-cell placement 202 includes two rows of I/O cells on all four sides of IC chip 200, thereby forming a double-ring structure.

Note that each I/O cell is defined by a bounding box (i.e., a cell boundary) and a specific location within IC chip 200, for example, the rectangular cells 206 and 208. However, the shape of the bounding box is not limited to rectangles but can have more complex geometries. Such I/O cells are discussed in more detail in conjunction with FIG. 2B. Note that an I/O cell, such as cell 206, is broadly defined, and is not limited to I/O pads, or I/O related objects. In some embodiments of the present invention, an I/O cell in an I/O-cell placement can include, but is not limited to: an I/O pad for coupling signals across a chip boundary; an I/O cell containing multiple I/O pins; a macro cell which typically has a larger size, complex geometry, and is often associated with complex functions; a placement blockage, which defines a forbidden area within the chip boundary; and a filler cell. Moreover, while FIG. 2A illustrates all I/O cells as separated from each other, in other embodiments, some I/O cells can partially overlap with neighboring cells.

Note that while I/O-cell placement 202 in FIG. 2A comprises two rings, in other embodiments, an I/O-cell placement can include a fewer or greater number of rings of I/O cells. In some embodiments, each side of a die can have one or multiple rows of I/O cells different from another side of the same die. Also note that, although FIG. 2A illustrates both rows of I/O cells having the same number of I/O cells, other multi-ring placements can have a different number of I/O cells in each of the rings. Hence, the I/O-cell placement 202 is for illustration purposes only, while the present technique can be applied to a chip layout having an I/O-cell placement of arbitrary configuration.

FIG. 2B illustrates an I/O-cell placement 210 which comprises a double-ring I/O-cell-structure and a macro cell 212. As illustrated in FIG. 2B, macro cell 212 has a hexagon bounding box, which is significantly larger than other I/O cells, and occupies an area that crosses over both I/O rings.

Scaling an I/O-Cell Placement

Embodiments of the present invention use a scaling technique to change the spaces between objects in an existing I/O-cell placement so that the new I/O-cell placement fits in the new die size in the same manner the original I/O-cell placement fits in the original die size.

In one embodiment, this scaling operation scales one side of an I/O area at a time. For each side, the scaling operation is a 1D operation that causes changes in one dimension. In one embodiment, such scaling changes occur in a dimension parallel to the side of the die being scaled. Referring to FIG. 2A, note that for I/O cells placed along the left or right side (i.e., the Y-dimension) of IC chip 200, the scaling occurs in the Y-dimension according to a change in the height H of the die size, while the X-coordinates of the associated I/O cells are simply shifted by the same amount according to a change in the X-coordinate of the new die size. On the other hand, for I/O cells placed along the bottom or top side of IC chip 200, the scaling occurs in the X-dimension according to a change in the width W of the die size, while the Y-coordinates of the associated I/O cells are simply shifted by the same amount according to a change in the Y-coordinate of the new die size. Although the scaling operation changes the spaces between the I/O cells, in some embodiments, the sizes and shapes of the I/O cells are fixed.

Moreover, the scaling operation takes into consideration a set of I/O-cell placement constraints. Such constraints can include, but are not limited to: minimum spacing constraint between adjacent I/O cells, relative location constraint between I/O cells, relative location constraint between I/O cells and the chip boundary, and a constraint that requires cell boundary or pins to be on the desired grid.

In one embodiment of the present invention, scaling in each side of an I/O-cell placement involves shrinking or expanding spaces between I/O cells located on this side. We define a distance between two adjacent cells as a distance between the two adjacent I/O cell boundaries. We additionally define an available space as a space between two adjacent I/O cells that is available for change during the scaling operation.

FIG. 3 illustrates exemplary distances and available spaces associated with a row of I/O cells in accordance with an embodiment of the present invention. More specifically, one side of an I/O-cell placement includes four adjacent I/O cells 302, 304, 306, and 308. This I/O-cell placement is subject to a design constraint of a 2 microns minimum spacing between a pair of adjacent I/O cells on each side of the placement. As shown in FIG. 3, the distance between I/O cell 302 and I/O cell 304 is 5 microns, the distance between I/O cell 304 and I/O cell 306 is 2 microns, and the distance between I/O cell 306 and I/O cell 308 is 3 microns. Hence, the available space between I/O cells 302 and 304 is 5−2=3 microns, the available space is 2−2=0 microns between cells 304 and 306, and the available space is 3−2=1 micron between cells 306 and 308.

Note that a zero available space indicates that the distance between a corresponding pair of I/O cells cannot be reduced any further. This constraint only affects a scaling operation that shrinks the die size. In other words, only non-zero available spaces can be shrunk during the scaling operation.

Note that for each side of an I/O-cell placement, a total available space can be defined as the sum of individual available spaces between pairs of adjacent I/O cells. For example, the total available space between I/O cells 302 and 308 equals 3+0+1=4 microns.

In one embodiment of the present invention, scaling each side of an I/O-cell placement involves shrinking or expanding spaces between I/O cells based on the identified available spaces on this side, the total available space on this side, and the die-size change along this side. Specifically, for a given side, if the target die size is smaller than the original die size, the scaling operation is a shrinking operation. If the target die size is larger than the original die size along this side, the scaling operation is an expanding operation. Although opposite sides of an I/O-cell placement always have the same type of scaling operation, the adjacent sides of an I/O-cell placement can have different types of scaling operations. In all cases, however, the die size differences between the original and target die sizes determine the total amount of shrinking or expanding during the scaling operations.

More specifically, when the target die size is given, the total amount of shrinking or expanding can be determined based on the differences in the width and height of the target die size and those of the original die size. In one embodiment of the present invention, each of the available spaces on a given side of the I/O-cell placement is shrunk/expanded by a specific amount such that the total amount of shrinking/expanding among all available spaces on this side is substantially equal to the difference between the target die size and the original die size along this side.

In the example of FIG. 2A, if the width (W) of the target die size is 200 microns smaller than the width of the original die size, the scaling operation is a shrinking operation, and the amount of shrinking of the available spaces for the I/O cells on the bottom side and the top side of the chip is substantially equal to 200 microns. However, if the total available space on the bottom side or the top side of the I/O-cell placement is less than 200 microns, the maximum amount of shrinking is thus substantially equal to the total available space computed for that side, instead of 200 microns.

During a scaling operation, different scaling functions can be used to scale individual available spaces. In one embodiment, the system scales a set of available spaces by shrinking/expanding each available space by an amount which is in proportion to the available space. In another embodiment, the system scales a set of available spaces by shrinking/expanding each available space by an equal amount. In yet another embodiment, the system scales a set of available spaces by shrinking/expanding each available space according to a non-linear proportionality relationship. In this embodiment, while the scaling function form can be different, the scaling function ensures that a larger available space receives greater change than a smaller available space. In each of the above-described embodiments, a total amount of scaling for the I/O cells on each side of the I/O-cell placement substantially equals the die-size change in that dimension.

In one embodiment of the present invention, if the total available space on one side of the original I/O-cell placement is less than a die-size reduction in the target die size in that dimension, the system scales all available spaces on that side to zero. By scaling all the available spaces to zero, the scaling operation achieves minimum possible die size while maintaining the I/O-cell placement constraints. This embodiment obtains minimum bound for the die size in one or both dimensions, which can be used to restrict the search range during die size exploration.

Note that the above-described technique for scaling a single row of I/O cells is readily applicable to scaling multi-ring I/O-cell placements, such as those illustrated in FIGS. 2A and 2B. More specifically, for a multi-ring I/O-cell placement, the scaling operation also operates on one side of the multi-ring I/O-cell placement at a time. For each side, the scaling operation is still a 1D operation which changes spaces in the same direction as scaling a single-ring I/O-cell placement. Based on the predetermined design constraints, the system can choose between a scaling operation which maintains I/O-cell alignment between the rings in the original placement or another scaling operation which ignores I/O-cell alignment between rings in the original placement. We describe these two options in more detail in conjunction with FIG. 4A and FIG. 4B.

In one embodiment of the present invention, to maintain cell alignment between different rings, all rings on one side of the I/O-cell placement are scaled together. More specifically, before scaling, the system identifies "common spaces" within the multi-ring structure, wherein a common space is a space shared by all rings.

FIG. 4A illustrates a process for identifying common spaces for an exemplary I/O-cell placement 400 comprising two edge-aligned I/O rings 402 and 404 in accordance with an embodiment of the present invention. In FIG. 4A, the identified spaces are: 406, 408, and 410 in ring 402, and 412, 414, and 416 in ring 410. The common spaces between ring 402 and ring 404 are the spaces 412, 414, and 416 because they are also shared by the corresponding spaces 406, 408, and 410 in ring 404, respectively.

Furthermore, FIG. 4B illustrates a process for identifying common spaces for an exemplary I/O-cell placement 420 comprising two staggered I/O rings 422 and 424 in accordance with an embodiment of the present invention. In this example, the common spaces are spaces 426-432 because they are spaces shared by both rings 422 and 424. Note that generally the common spaces shared by multiple rings can be found by taking an AND operation on all spaces between cells.

Once the common spaces are identified, the scaling operation can be performed on all rings of a multi-ring structure by scaling the set of common spaces according to the same procedure described for scaling a single-row I/O-cell placement. In one embodiment of the present invention, these common spaces are treated as the "distances" described in the single-ring scenario, and the available spaces are subsequently identified from the common spaces.

In an alternative embodiment, when ignoring the cell alignment between rings in the original I/O-cell placement, the system scales each ring in a multi-ring structure separately, and hence the single-row scaling technique applies to each ring in the multi-ring structure. For example, in FIG. 4A, the system scales ring 402 based on the set of spaces 406-410, and separately scales ring 404 based on the set of spaces 412-416. As a result, the original alignments between rings 402 and 404 are likely to be changed.

Note that both of the multi-ring scaling techniques keep I/O cells in their original I/O rings, and maintain the sides and relative orders of the I/O cells.

Note that the above-described scaling techniques effectively resolve the complexity involved in re-placing macro cells which may extend across multiple rings (such as cell 212 in FIG. 2B). This is because the scaling operation can separately process the portion of a complex macro cell in each ring as a regular cell, other than treating the entire macro cell as a whole.

Process for Scaling an I/O-Cell Placement

Figure 5:
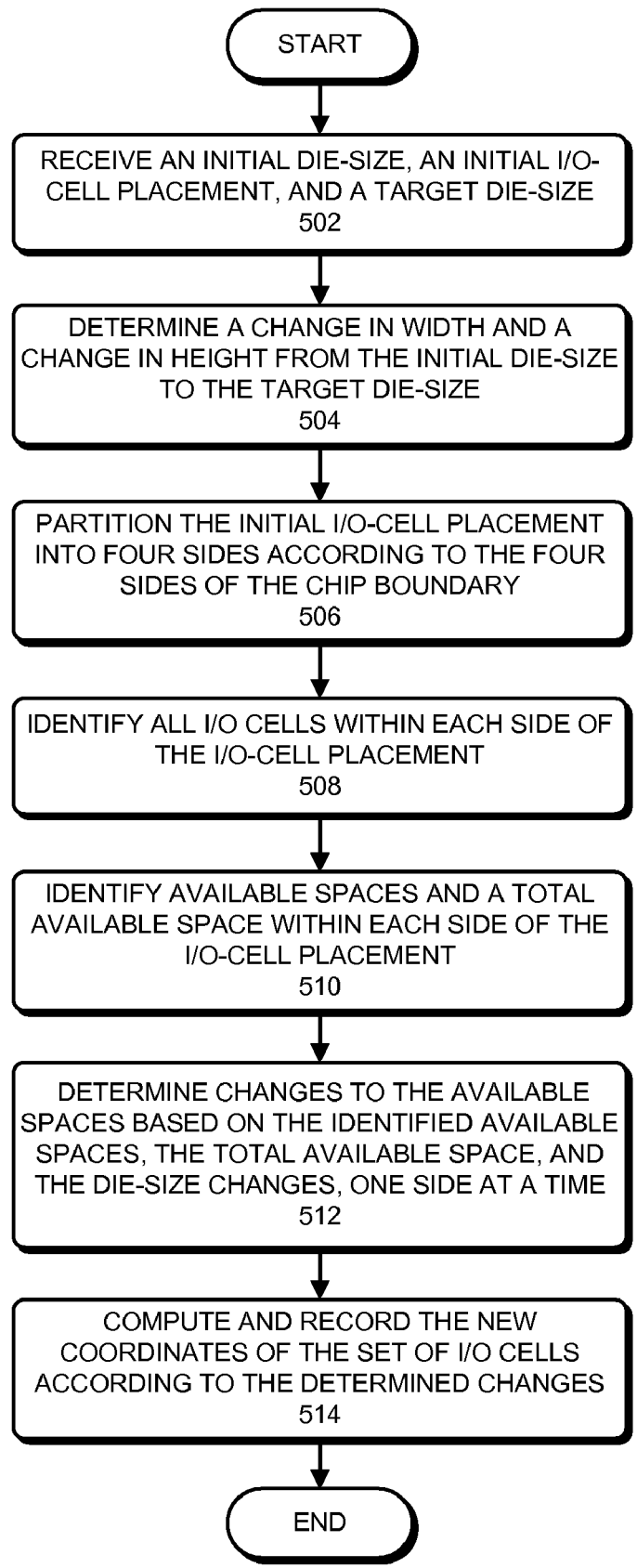
FIG. 5 presents a flowchart illustrating a process of scaling an I/O-cell placement to adjust for a die-size change in accordance with an embodiment of the present invention.

FIG. 5 presents a flowchart illustrating a process of scaling an I/O-cell placement to adjust for a die-size change in accordance with an embodiment of the present invention.

During operation, the system receives an initial IC design comprising an initial die-size (i.e., original width and height of the die) and an initial I/O-cell placement for a set of I/O cells (step 502). Note that the set of I/O cells can include but is not limited to, I/O pads, I/O cells containing multiple I/O pins, macro cells, placement blockages, filler cells, and other types of I/O cells. The system additionally receives a target die-size (i.e., target width and height of the die) (step 502). The system subsequently determines a change in width and a change in height from the initial die-size to the target die-size (step 504).

The system then partitions the initial I/O-cell placement into different I/O placement areas (step 506). In particular, the system partitions the I/O-cell placement into four sides according to the four sides of the chip boundary.

Next, the system identifies all I/O cells within each side of the I/O-cell placement (step 508). For each identified I/O cell, the system records both the location of the cell (i.e., the X and Y coordinates), and the geometry of the cell.

Note that sometimes one or more I/O cells identified on one side of the I/O-cell placement can also be identified to be within another side of the I/O-cell placement. Such I/O cells, which are "shared by" two adjacent sides of the I/O-cell placement, are typically located in a corner (i.e., a corner cell) or near the corner of the die where the two sides meet. In one embodiment of present invention, instead of scaling with both sides of the I/O-cell placement, such I/O cells are only scaled with one of the two sides. More specifically, when an I/O cell is identified to be shared by two sides, the system then determines which of the two sides this I/O cell is more closely associated with (for example, based on the distances to the corresponding chip boundaries). Next, the I/O cell is only scaled with the side to which the I/O cell is more closely related. Moreover, the same cell becomes a constraint to the scaling operation of the other side which the cell is less closely associated with. We describe an example which involves such cells in conjunction with FIG. 6.

Based on the recorded cell information, the system then identifies available spaces within each side of the I/O-cell placement, and additionally obtains a total available space for each side of the I/O-cell placement (step 510).

Next, the system determines the changes (i.e., shrinking or expanding) to the available spaces based on the identified available spaces, the total available space, and the die-size changes, one side at a time (step 512). For each side, the scaling operation is a 1D scaling in the direction parallel to the side. More specifically, the system changes the available spaces according to a predetermined scaling relationship, such as a linear-proportionality scaling according to the amount of available spaces, or an equal amount scaling for all available spaces. In some embodiments, the total amount of changes to all available spaces due to the scaling substantially equals the die-size change in that dimension. However, if the total available space is less than the corresponding die-size change, and the scaling is a shrinking operation, the system scales all the available spaces to zero, and the scaling operation achieves minimum possible die size on this side.

After determining the changes to the available spaces, the system then computes and records the new coordinates of the set of I/O cells according to the determined changes, thereby obtaining an updated I/O-cell placement (step 514).

Figure 6:
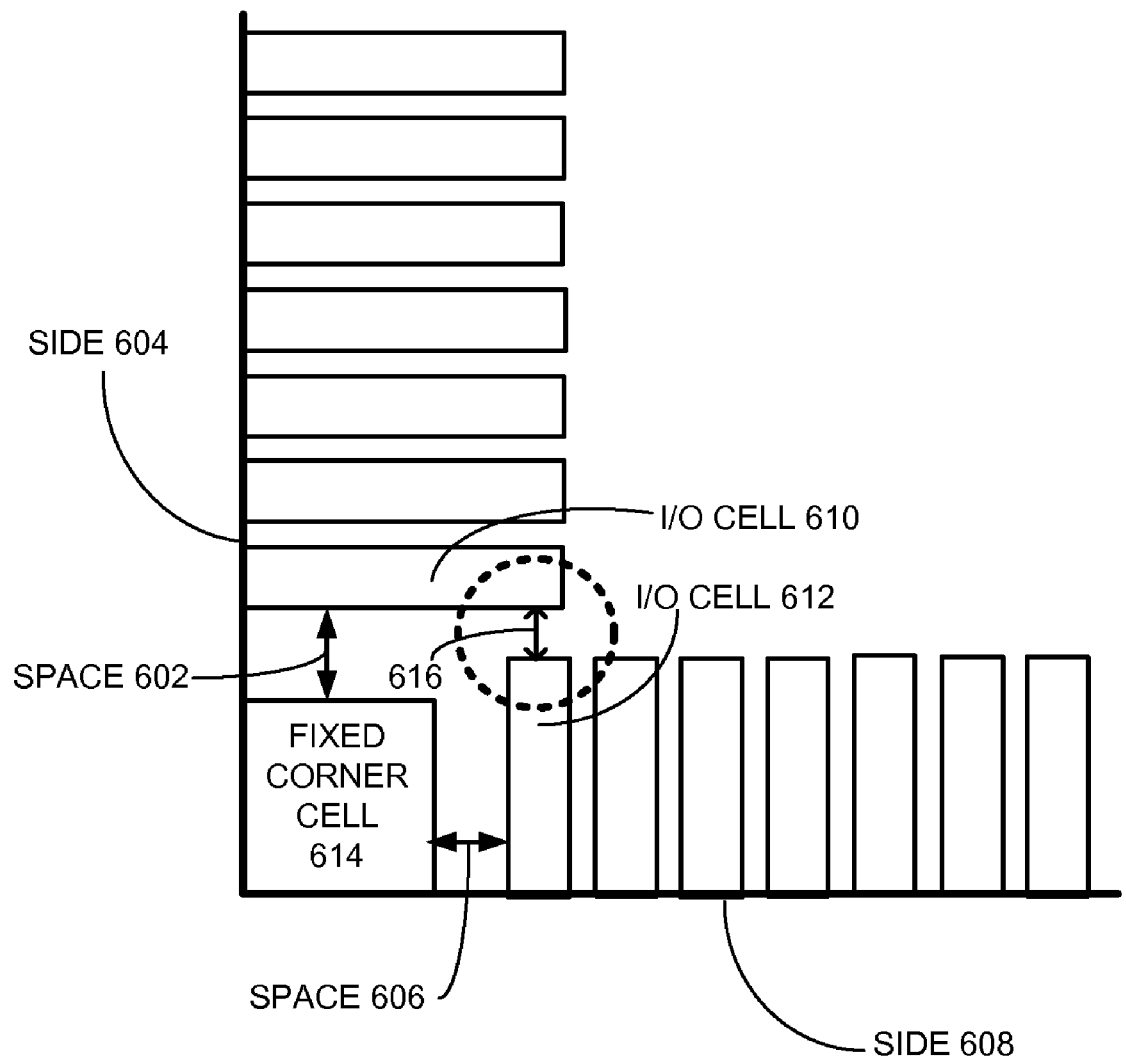
FIG. 6 illustrates a potential conflict condition in the corner of a die due to scaling two adjacent sides of the die in accordance with an embodiment of the present invention.

Note that while each side of the I/O-cell placement can be independently modified, interference between adjacent sides in the corners of the die can occur when the scaling operation involves shrinking of the available spaces. FIG. 6 illustrates a potential conflict condition in the corner of a die due to scaling two adjacent sides of the die in accordance with an embodiment of the present invention. Specifically, when independently shrinking a space 602 (between an I/O cell 610 and a fixed corner cell 614) on side 604, and reducing a space 606 (between an I/O cell 612 and fixed corner cell 614) on side 608, I/O cell 610 on side 604 can become overlapped with or get too close to I/O cell 612 on side 608. In one embodiment of the present invention, the system can detect such conflict during the scaling operation. Typically, a conflict can be detected when the distance between the two corner I/O cells (e.g., a distance 616 between cells 610 and 612) is less than a minimum space specified by the design rules. Once the conflict is detected, a remedial action can be taken, which can involve backtracking one side or both sides of the space changes until the overlapping condition is removed, and the minimum space rules are satisfied. Note that the system can also assign a priority value to each side before the scaling, and subsequently use the priority values to determine an order for scaling and an order for backtracking if a conflict occurs.

After the backtracking to resolve the conflict, the system can subsequently determine one or more minimum spaces near the corner of the die. For example, distance 616 between I/O cells 610 and 612 after the backtracking determines the minimum space for space 602. The system then sets these spaces as "reversed spaces" which cannot be scaled in the subsequent scaling operations, and in this way avoids the same types of conflicts to repeat.

In one embodiment of the present invention, during a scaling process, the system can take a proactive step to prevent a conflict from occurring in the first place. Note that the above-described conflict condition typically involves a corner cell that is shared by two sides, such as I/O cell 612. Hence, after the first side of the two sides, such as side 608, has been scaled, the system next re-identifies I/O cells for the second side of the two sides which is to be scaled next. If one or more shared cells are identified before scaling the second side, and the system determines that the shared cells are not scaled with the other identified I/O cells of the second side (e.g., I/O cell 612 is such a cell to side 604), a potential conflict is identified. Subsequently, these identified shared cells, such as I/O cell 612, become constraints (i.e., minimum space rules apply) to the scaling of the second side, such as side 604. Consequently, a conflict, such as the one between I/O cells 610 and 612, can be avoided.

Integrating the I/O Scaling with Die-Size Exploration

Figure 7:
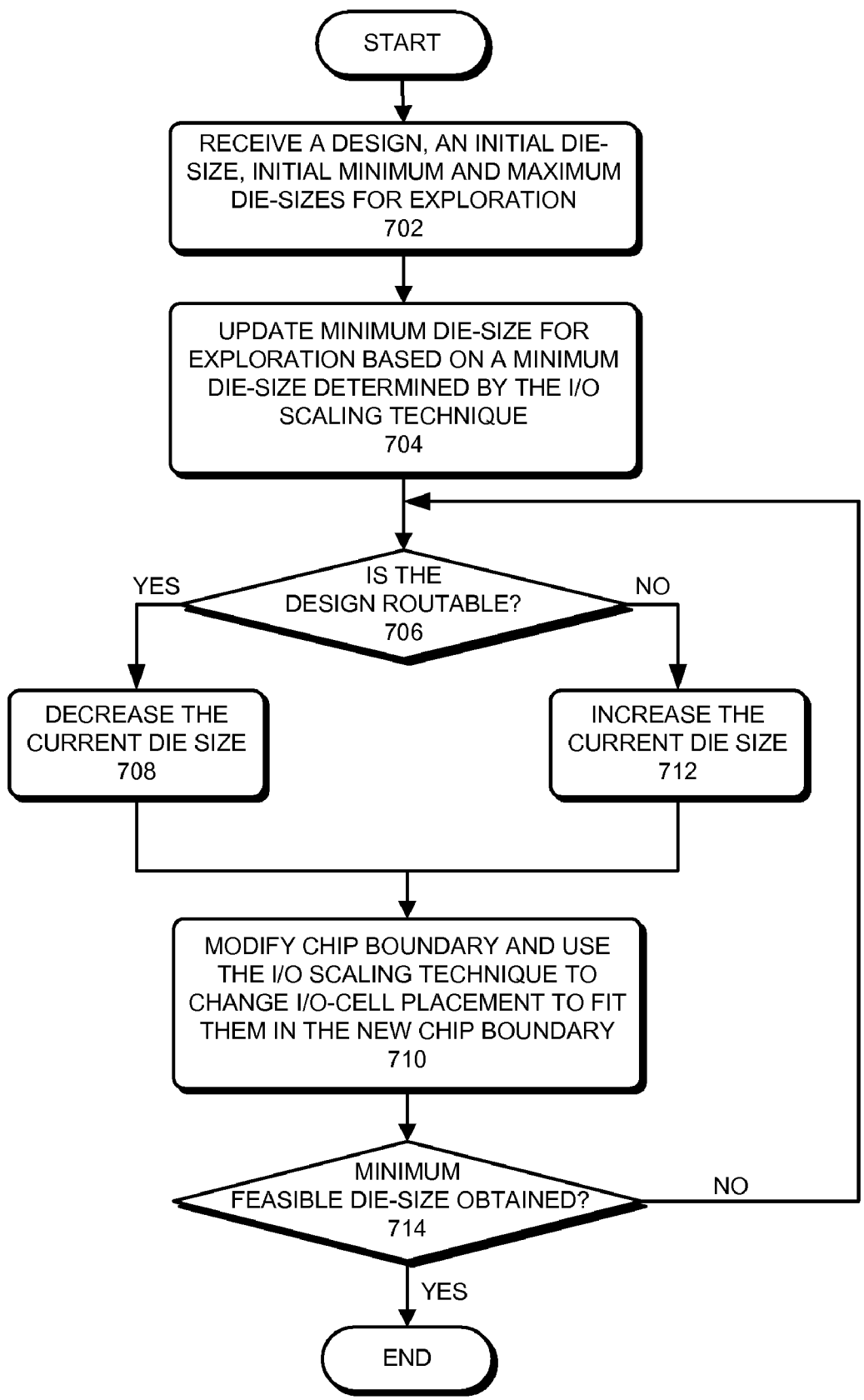
FIG. 7 presents a flowchart illustrating a process of performing die-size exploration while using the scaling technique to change I/O-cell placement to adjust for a die-size change in accordance with an embodiment of the present invention.

FIG. 7 presents a flowchart illustrating a process of performing die-size exploration while using the scaling technique to change I/O-cell placement to adjust for a die-size change in accordance with an embodiment of the present invention.

During operation, the system starts by receiving a design, an initial die size, and initial minimum and maximum die sizes for exploration (step 702). The system then uses the above-described I/O-cell scaling technique to determine a new minimum die size, and subsequently updates the initial minimum die size with the new minimum die size for exploration (step 704). In some embodiments, step 704 may be optional.

Next, the system determines if the design is routable under the current die size (step 706).

If so (i.e., if it is possible to further reduce the die size), the system decreases the die size by a predetermined amount (step 708), and subsequently modifies the chip boundary and uses the above-described I/O scaling technique to change I/O-cell placement to fit in the new chip boundary (step 710).

If the system determines that the design is not routable under the current die size, the system then increases the die size by a predetermined amount to increase the routing area (step 712), and subsequently modifies the chip boundary and uses the above-described I/O scaling technique to change I/O-cell placement to fit in the new chip boundary (step 710).

For both of the above scenarios, upon completing step 710, the system determines if a minimum feasible (routable) die size has been obtained (step 714). If so, the die-size exploration terminates. Otherwise, the system returns to step 706 and repeats.

Figure 8:
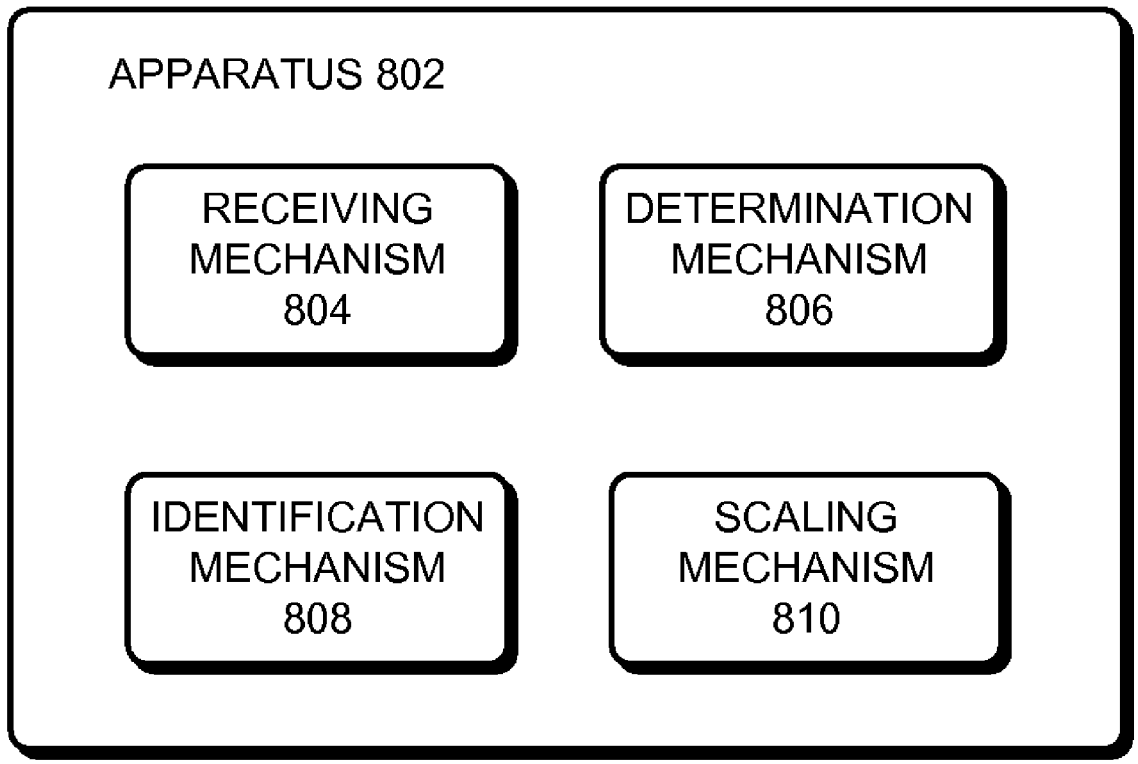
FIG. 8 illustrates an apparatus that scales an I/O-cell placement during die-size optimization in accordance with an embodiment of the present invention.

FIG. 8 illustrates an apparatus that scales an I/O-cell placement during die-size optimization in accordance with an embodiment of the present invention.

Apparatus 802 can comprise mechanisms which communicate with one another via a wire or wireless communication channel. Specifically, apparatus 802 can comprise a receiving mechanism 804, a determination mechanism 806, an identification mechanism 808, and a scaling mechanism 810. A mechanism may be realized using one or more integrated circuits or as a module of a general purpose processor. Apparatus 802 can be part of a computer system.

In some embodiments, receiving mechanism 804 may be configured to receive an initial die-size for a die and an initial I/O-cell placement for a set of I/O cells, and to additionally receive a target die-size for the die; determination mechanism 806 may be configured to determine die-size changes between the initial die-size and the target die-size; identification mechanism 808 may be configured to identify available spaces between the set of I/O cells in the initial I/O-cell placement; and scaling mechanism 810 may be configured to scale the initial I/O-cell placement based on the identified available spaces and the die-size changes, thereby obtaining a new I/O-cell placement which fits in the target die-size.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for scaling an I/O-cell placement during die-size optimization, the method comprising:
   receiving an initial die-size for a die and an initial I/O-cell placement for a set of I/O cells, wherein the initial die-size includes an initial width and an initial height;
   receiving a target die-size for the die, wherein the target die-size includes a target width and a target height;
   determining die-size changes between the initial die-size and the target die-size, which includes determining a width change from the initial width to the target width and a height change from the initial height to the target height;
   identifying an available space between each pair of adjacent I/O cells in the set of I/O cells by subtracting a minimum space requirement from a distance between the pair of adjacent I/O cells; and
   scaling, by computer, the initial I/O-cell placement so that a total amount of shrinking or expanding of available spaces between pairs of adjacent I/O cells along a given side is substantially equal to a difference between the target die-size and the initial die-size along the given side.

2. The method of claim 1, wherein identifying available spaces between the set of I/O cells in the initial I/O-cell placement involves independently identifying available spaces in a row of I/O cells for each side of the die.

3. The method of claim 2, wherein identifying the available spaces in the row of I/O cells on one side of the die involves:
   identifying an available space between each pair of adjacent I/O cells in the row of I/O cells; and
   computing a total available space on the side of the die by summing the available spaces in the row of I/O cells.

4. The method of claim 3, wherein scaling the initial I/O-cell placement involves independently scaling the I/O-cell placement on each side of the die.

5. The method of claim 4, wherein scaling the initial I/O-cell placement on one side of the die involves:
   determining a scaling mode (shrinking/expanding) based on a sign of the die-size change in a direction along the side of the die; and
   scaling each of the spaces between pairs of adjacent I/O cells in the row of I/O cells by an amount which is in proportion to a corresponding available space.

6. The method of claim 4, wherein scaling the initial I/O-cell placement on one side of the die involves:
   determining a scaling mode (shrinking/expanding) based on a sign of the die-size change in a direction along the side of the die; and
   scaling each of the spaces between pairs of adjacent I/O cells in the row of I/O cells by an equal amount.

7. The method of claim 4, wherein scaling the initial I/O-cell placement on one side of the die involves:
   determining a scaling mode (shrinking/expanding) based on a sign of the die-size change in a direction along the side of the die; and
   if the die-size change is negative and has a value greater than the total available space on the side of the die, scaling the spaces between pairs of adjacent I/O cells in the row of I/O cells by reducing all available spaces to zero.

8. The method of claim 4, wherein if the initial I/O-cell placement is a multi-ring I/O-cell placement, the method further comprises:
   independently scaling each ring of the multi-ring I/O-cell-placement; or
   concertedly scaling the multiple rings of I/O cells in the multi-ring I/O-cell-placement, while maintaining alignment between the multiple rings of I/O cells.

9. The method of claim 1, wherein the set of I/O cells include at least one of the following:
   I/O pads;
   I/O cells comprising multiple I/O pins;
   macro cells;
   placement blockages; and
   filler cells.

10. A non-transitory computer-readable storage medium storing instructions that when executed by a computer cause the computer to perform a method for scaling an I/O-cell placement during die-size optimization, the method comprising:
   receiving an initial die-size for a die and an initial I/O-cell placement for a set of I/O cells, wherein the initial die-size includes an initial width and an initial height;
   receiving a target die-size for the die, wherein the target die-size includes a target width and a target height;
   determining die-size changes between the initial die-size and the target die-size, which includes determining a width change from the initial width to the target width and a height change from the initial height to the target height;

identifying an available space between each pair of adjacent I/O cells in the set of I/O cells by subtracting a minimum space requirement from a distance between the pair of adjacent I/O cells; and scaling the initial I/O-cell placement so that a total amount of shrinking or expanding of available spaces between pairs of adjacent I/O cells along a given side is substantially equal to a difference between the target die-size and the initial die-size along the given side.

11. The non-transitory computer-readable storage medium of claim 10, wherein identifying available spaces between the set of I/O cells in the initial I/O-cell placement involves independently identifying available spaces in a row of I/O cells for each side of the die.

12. The non-transitory computer-readable storage medium of claim 11, wherein identifying the available spaces in the row of I/O cells on one side of the die involves:

identifying an available space between each pair of adjacent I/O cells in the row of I/O cells; and computing a total available space on the side of the die by summing the available spaces in the row of I/O cells.

13. The non-transitory computer-readable storage medium of claim 12, wherein scaling the initial I/O-cell placement involves independently scaling the I/O-cell placement on each side of the die.

14. The non-transitory computer-readable storage medium of claim 13, wherein scaling the initial I/O-cell placement on one side of the die involves:

determining a scaling mode (shrinking/expanding) based on a sign of the die-size change in a direction along the side of the die; and scaling each of the spaces between pairs of adjacent I/O cells in the row of I/O cells by an amount which is in proportion to a corresponding available space.

15. The non-transitory computer-readable storage medium of claim 13, wherein scaling the initial I/O-cell placement on one side of the die involves:

determining a scaling mode (shrinking/expanding) based on a sign of the die-size chance in a direction along the side of the die; and scaling each of the spaces between pairs of adjacent I/O cells in the row of I/O cells by an equal amount.

16. The non-transitory computer-readable storage medium of claim 13, wherein scaling the initial I/O-cell placement on one side of the die involves:

determining a scaling mode (shrinking/expanding) based on a sign of the die-size change in a direction along the side of the die; and if the die-size change is negative and has a value greater than the total available space on the side of the die, scaling the spaces between pairs of adjacent I/O cells in the row of I/O cells by reducing all available spaces to zero.

17. The non-transitory computer-readable storage medium of claim 13, wherein if the initial I/O-cell placement is a multi-ring I/O-cell placement, the method further comprises:

independently scaling each ring of the multi-ring I/O-cell-placement; or concertedly scaling the multiple rings of I/O cells in the multi-ring I/O-cell-placement, while maintaining alignment between the multiple rings of I/O cells.

18. The non-transitory computer-readable storage medium of claim 10, wherein the set of I/O cells include at least one of the following:

I/O pads;
I/O cells comprising multiple I/O pins;
macro cells;
placement blockages; and
filler cells.

19. An apparatus that scales an I/O-cell placement during die-size optimization, comprising:

a receiving mechanism configured to receive an initial die-size for a die and an initial I/O-cell placement for a set of I/O cells, wherein the initial die-size includes an initial width and an initial height;

wherein the receiving mechanism is further configured to receive a target die-size for the die, wherein the target die-size includes a target width and a target height;

a determination mechanism configured to determine die-size changes between the initial die-size and the target die-size, which includes determining a width change from the initial width to the target width and a height change from the initial height to the target height;

an identification mechanism configured to identify an available space between each pair of adjacent I/O cells in the set of I/O cells by subtracting a minimum space requirement from a distance between the pair of adjacent I/O cells; and a scaling mechanism configured to scale the initial I/O-cell placement so that a total amount of shrinking or expanding of available spaces between pairs of adjacent I/O cells along a given side is substantially equal to a difference between the target die-size and the initial die-size along the given side.

* * * * *